(12) United States Patent
Sasaki (10) Patent No.: US 7,884,601 B2
(45) Date of Patent: Feb. 8, 2011

(54) MAGNETIC DETECTION DEVICE AND ELECTRONIC APPARATUS EQUIPPED WITH THE SAME

(75) Inventor: Yoshito Sasaki, Niigata-ken (JP)

(73) Assignee: ALPS Electric Co., Ltd., Tokyo (JP)

( * ) Notice: Subject to any disclaimer, the term of this patent is extended or adjusted under 35 U.S.C. 154(b) by 281 days.

(21) Appl. No.: 12/256,737

(22) Filed: Oct. 23, 2008

(65) Prior Publication Data
US 2009/0051357 A1    Feb. 26, 2009

Related U.S. Application Data

(63) Continuation of application No. PCT/JP2007/072166, filed on Nov. 15, 2007.

(30) Foreign Application Priority Data

Nov. 17, 2006    (JP) .............................. 2006-311211

(51) Int. Cl.
*G01R 33/09*    (2006.01)
*G01B 7/14*    (2006.01)

(52) U.S. Cl. ................................. 324/252; 324/207.21
(58) Field of Classification Search ............ 324/207.21, 324/252
See application file for complete search history.

(56) References Cited

U.S. PATENT DOCUMENTS 6,937,008 B2 *   8/2005   Matsuzaki et al. ....... 324/207.2
7,427,859 B2 *   9/2008   Fukuoka et al. ........ 324/207.21

* cited by examiner

*Primary Examiner*—Reena Aurora
(74) *Attorney, Agent, or Firm*—Brinks Hofer Gilson & Lione (57) ABSTRACT

A magnet is contained in a display housing and is supported by a slidable operating member. A control housing contains a magnetoresistance effect element. Slidable shifting of the operating member causes an external magnetic field in a positive (+) direction and an external magnetic field in a negative (−) direction to enter the magnetoresistance effect element from the magnet at different timings, thereby changing the electric resistance of the magnetoresistance effect element. Accordingly, when the operating member is slidably shifted, a switching operation between predetermined modes is performed on the basis of a change in the resistance of the magnetoresistance effect element.

5 Claims, 11 Drawing Sheets

FIG. 13

MAGNETIC DETECTION DEVICE AND ELECTRONIC APPARATUS EQUIPPED WITH THE SAME

CLAIM OF PRIORITY

This application is a continuation of JAPAN PCT/JP2007/072166 filed on Nov. 15, 2007 and further claims benefit of the Japanese Patent Application No. 2006-311211 filed on Nov. 17, 2006.

BACKGROUND OF THE INVENTION

1. Field of the Invention

The present invention relates to noncontact-type magnetic detection devices equipped with magnetoresistance effect elements, and particularly, to a magnetic detection device that can perform dipole detection with a simple structure, and to an electronic apparatus equipped with such a magnetic detection device so as to allow for a simple switching operation between predetermined modes.

2. Description of the Related Art

Normally, when a notebook personal computer is closed with the power left on, the computer switches to a sleep mode, which is a power-saving mode where the display screen is turned off.

On the other hand, a switching operation with the use of software for maintaining the normal operation mode even when the notebook personal computer is in a closed state has been implemented in the related art. In this case, for example, the display screen is kept turned on without being switched to a sleep mode even while the notebook personal computer is in a closed state. See Japanese Unexamined Patent Application Publication Nos. 11-85449, 9-274474, 2006-163294, and 2004-310658 for examples of related art.

However, to perform such a switching operation through the use of software as described above, it is necessary for the operator to first perform a preliminarily input operation on the computer while kept in an opened state so that the computer can be set to a non-sleep mode when it is closed. Furthermore, in the case where the setting and cancelling of a non-sleep mode are to be performed through the use of software as mentioned above, a corresponding program must be activated every time to perform the setting or cancelling operation. This unfavorably places an excessive burden on the operator.

None of the inventions set forth in Japanese Unexamined Patent Application Publications mentioned above includes any description with regard to the setting and cancelling of a non-sleep mode for the closed state of a notebook personal computer.

Japanese Unexamined Patent Application Publication No. 11-85449 discloses an invention that relates to a process for detecting the opening and closing of a notebook personal computer through the use of software.

Although Japanese Unexamined Patent Application Publication No. 9-274474 discloses an invention that relates to a slide switch, a detection circuit thereof is undesirable due to its complex configuration. In addition, since this slide switch is of a contact type, the slide switch is problematic in that it cannot ensure a long life span.

Japanese Unexamined Patent Application Publication No. 2006-163294 discloses an invention that relates to detection of the orientation of a portable phone by means of an acceleration sensor. Therefore, it is unlikely that this can be applied to the setting and cancelling of a non-sleep mode.

Japanese Unexamined Patent Application Publication No. 2004-310658 discloses an invention for detecting the rotation of a display portion of a notebook personal computer by using a magnetic detector element and a magnet. It is mentioned in Japanese Unexamined Patent Application Publication No. 2004-310658 that the magnetic detector element is defined by a reed switch. However, since a reed switch is a proximity switch, it is necessary that the magnet be distant from the reed switch in order to create a non-magnetic-field condition where an external magnetic field is not effective on the reed switch. In addition, a rotation-detection method that employs a reed switch always requires at least two reed switches at positions distant from each other. Specifically, it is necessary that when one reed switch is detecting a magnetic field, the other reed switch be placed at a position where it does not detect the magnetic field, and vice versa. This disadvantageously tends to increase the size of the device.

SUMMARY OF THE INVENTION

The present invention provides a magnetic detection device that achieves a simple and compact dipole detectable structure with the use of a magnetoresistance effect element that utilizes a magnetoresistive effect, and an electronic apparatus equipped with such a magnetic detection device so as to allow for a simple switching operation.

A magnetic detection device according to the present invention includes a magnetoresistance effect element having a multilayer structure and utilizing a magnetoresistive effect in which an electric resistance of the magnetoresistance effect element changes with respect to an external magnetic field; an integrated circuit connected to the magnetoresistance effect element and outputting a magnetic-field detection signal on the basis of a change in the electric resistance; and a magnet for generating the external magnetic field. The magnetoresistance effect element and the magnet are disposed facing each other with a certain distance therebetween. At least one of the magnetoresistance effect element and the magnet is supported in a reciprocable fashion towards a front side or rear side of the other one of the magnetoresistance effect element and the magnet or in a rotatable fashion with respect to the other one so as to allow an external magnetic field in a positive (+) direction and an external magnetic field in a negative (−) direction opposite to the positive (+) direction to enter the magnetoresistance effect element from the magnet at different timings in a planar direction parallel to a multilayer interface of the multilayer structure. In response to reciprocation or rotation of the at least one of the magnetoresistance effect element and the magnet, the integrated circuit outputs a positive (+) magnetic-field detection signal on the basis of a change in the electric resistance of the magnetoresistance effect element caused by the external magnetic field in the positive (+) direction, and outputs a negative (−) magnetic-field detection signal on the basis of a change in the electric resistance of the magnetoresistance effect element caused by the external magnetic field in the negative (−) direction.

According to the present invention, in a noncontact-type magnetic detection device equipped with a magnetoresistance effect element that utilizes a magnetoresistive effect, a simple and compact dipole detectable structure can be achieved.

A magnetoresistance effect element that utilizes a magnetoresistive effect can detect a change in the direction of an external magnetic field (which will be referred to as a "horizontal magnetic field" hereinafter) acting in a planar direction parallel to the multilayer interface of the multilayer structure. As described above, in the present invention, at least one of the magnetoresistance effect element and the magnet is disposed in a reciprocable fashion or in a rotatable fashion with respect to the other one of the magnetoresistance effect element and the magnet so as to allow horizontal magnetic fields in the positive (+) and negative (−) directions to enter the magnetoresistance effect element at different timings. With this configuration, a magnetic-field condition in which the horizontal magnetic fields in the positive (+) and negative (−) directions are applied to the magnetoresistance effect element at different timings can be easily created within a small space, thereby achieving a simple and compact dipole-detectable magnetic detection device.

In the present invention, it is preferable that a center of the magnetoresistance effect element and a center of the magnet be positioned on a same central axis, and that the at least one of the magnetoresistance effect element and the magnet be supported rotatably about the central axis serving as a rotation axis. Accordingly, in the case where the at least one of the magnetoresistance effect element and the magnet is configured to be supported in a rotatable fashion, the magnetic detection device can be appropriately reduced in size.

The present invention also provides an electronic apparatus that includes the above-described magnetic detection device and a reciprocatingly manipulable or rotationally manipulable operating member on a surface of the electronic apparatus. The operating member supports the magnetoresistance effect element or the magnet. The electronic apparatus is switchable between predetermined modes on the basis of the positive (+) magnetic-field detection signal and the negative (−) magnetic-field detection signal output at the integrated circuit when the operating member is operated.

With the use of the above-described magnetic detection device, the present invention can provide an electronic apparatus that allows for a simple switching operation. Specifically, the electronic apparatus can be readily switched between predetermined modes by reciprocating or rotating the operating member.

In the present invention, the electronic apparatus may further include a first component and a second component that are supported in an openable and closable fashion. In this case, the operating member is preferably provided on a surface of one of the first component and the second component when the first component and the second component are in a closed state. In this manner, the electronic apparatus can be readily switched between predetermined modes by simply operating the operating member in the state where the first component and the second component are closed.

In this case, it is preferable that the magnetoresistance effect element and the integrated circuit be contained in one of the first component and the second component, and that the magnet be contained in the other one of the first component and the second component. The opening and closing of the first component and the second component are preferably detectable on the basis of a change in the electric resistance of the magnetoresistance effect element occurring in response to a change in magnetic intensity of the external magnetic field from the magnet, the change in magnetic intensity being caused by the opening and closing of the first component and the second component. Consequently, the switching operation between the predetermined modes and the opening/closing detection can be performed with the use of the same magnetic detection device, thereby reducing the installation space of the magnetic detection device.

DESCRIPTION OF THE PREFERRED EMBODIMENTS

Figure 1:
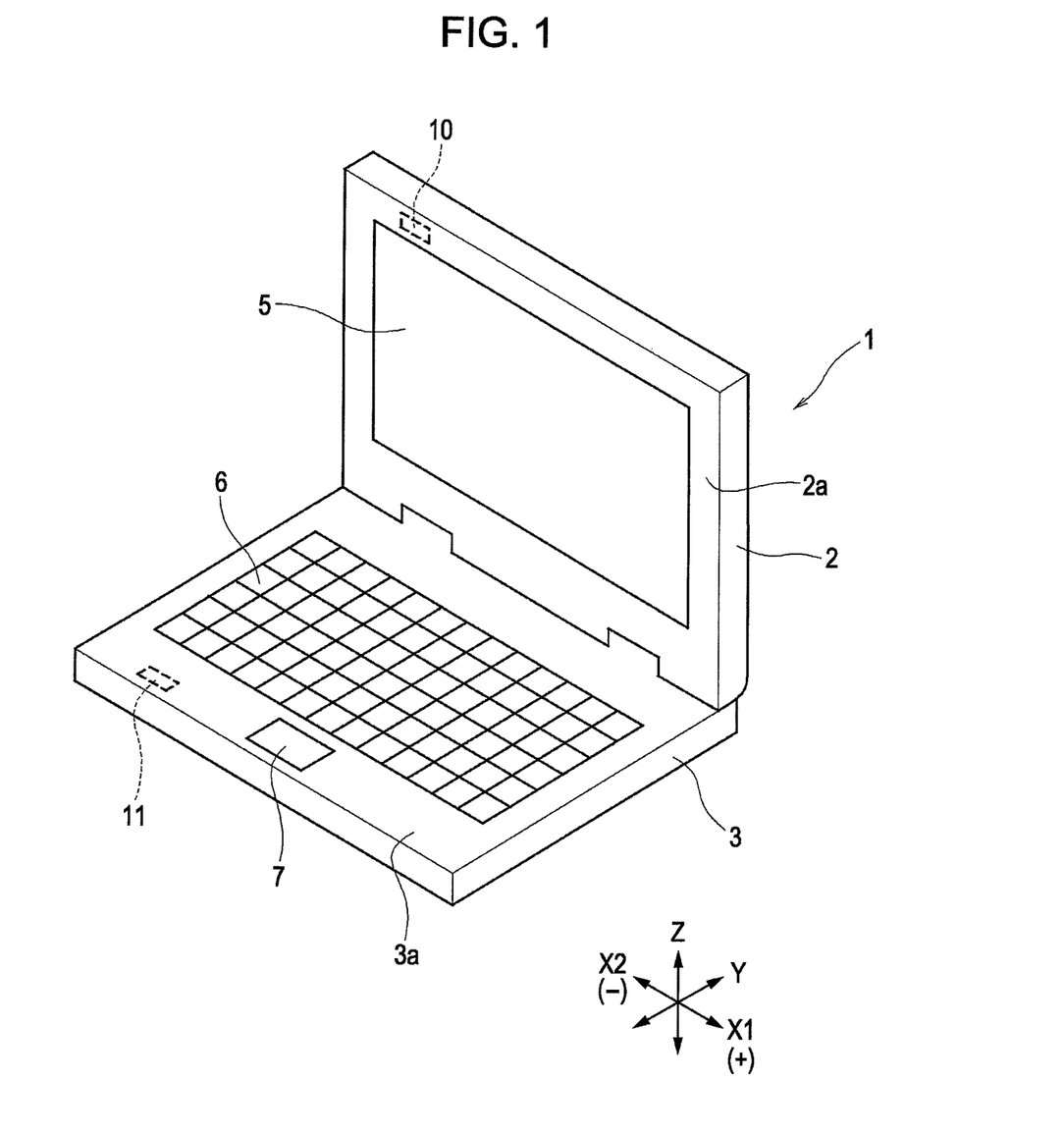
FIG. 1 is a perspective view of a notebook personal computer shown in an opened state.
Figure 2:
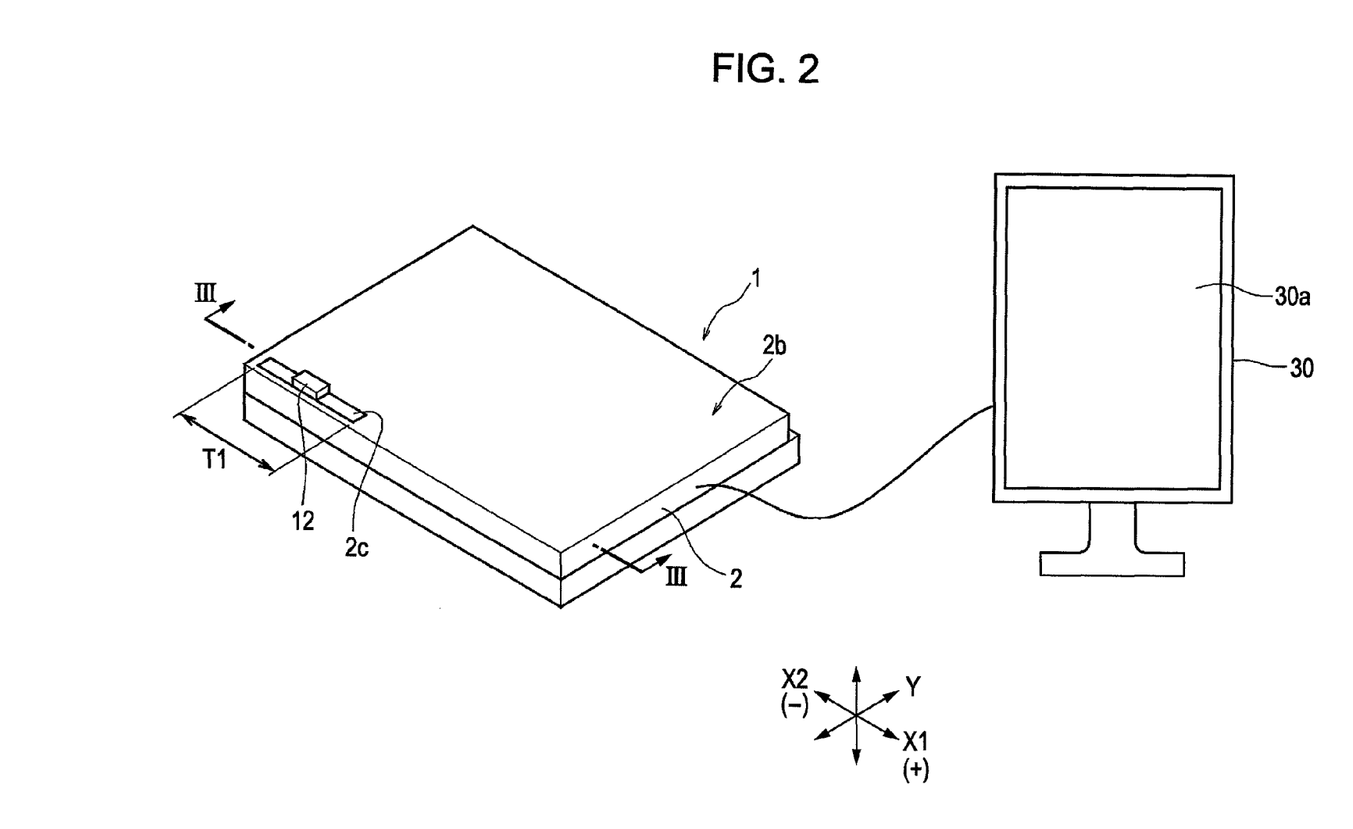
FIG. 2 includes a perspective view of the notebook personal computer shown in a closed state and a front view of a monitor connected to the computer.
Figure 3:
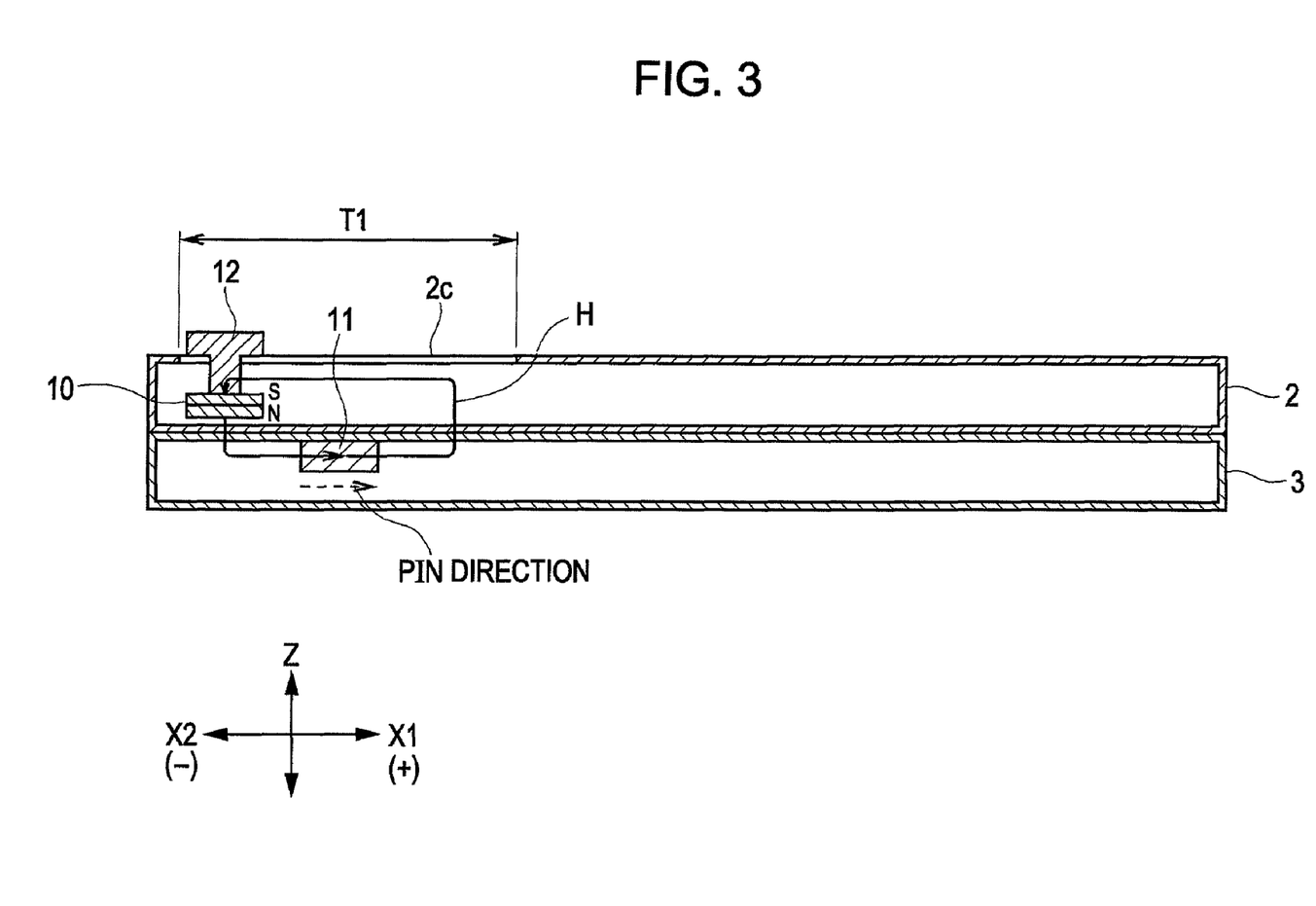
FIG. 3 is a partial cross-sectional view taken in the height direction along line III-III in FIG. 2 as viewed from the direction of the arrows, and shows a first switch mode in the closed state of the notebook personal computer.
Figure 4:
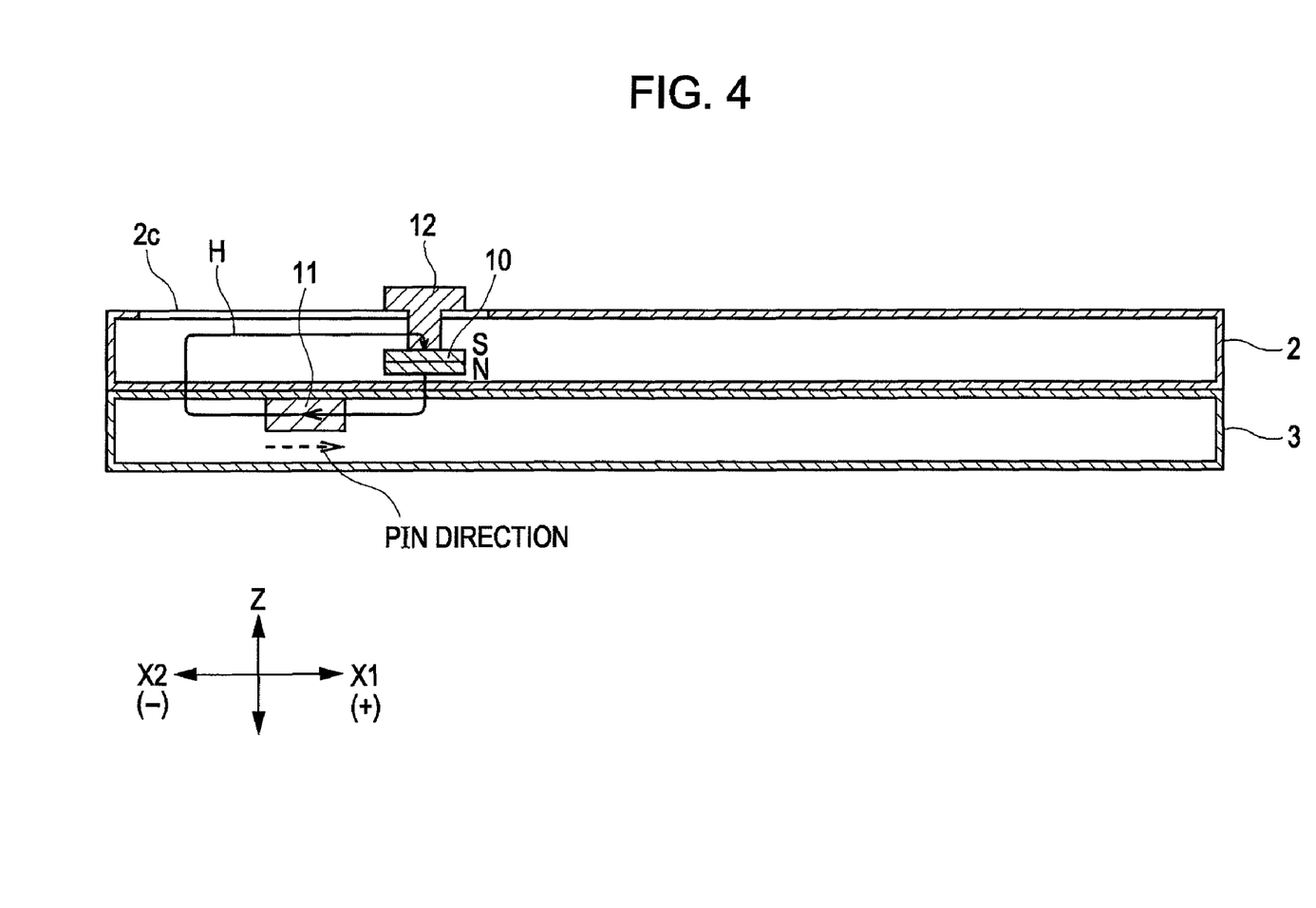
FIG. 4 is a partial cross-sectional view corresponding to FIG. 3 and shows a second switch mode in the closed state of the notebook personal computer.
Figure 5:
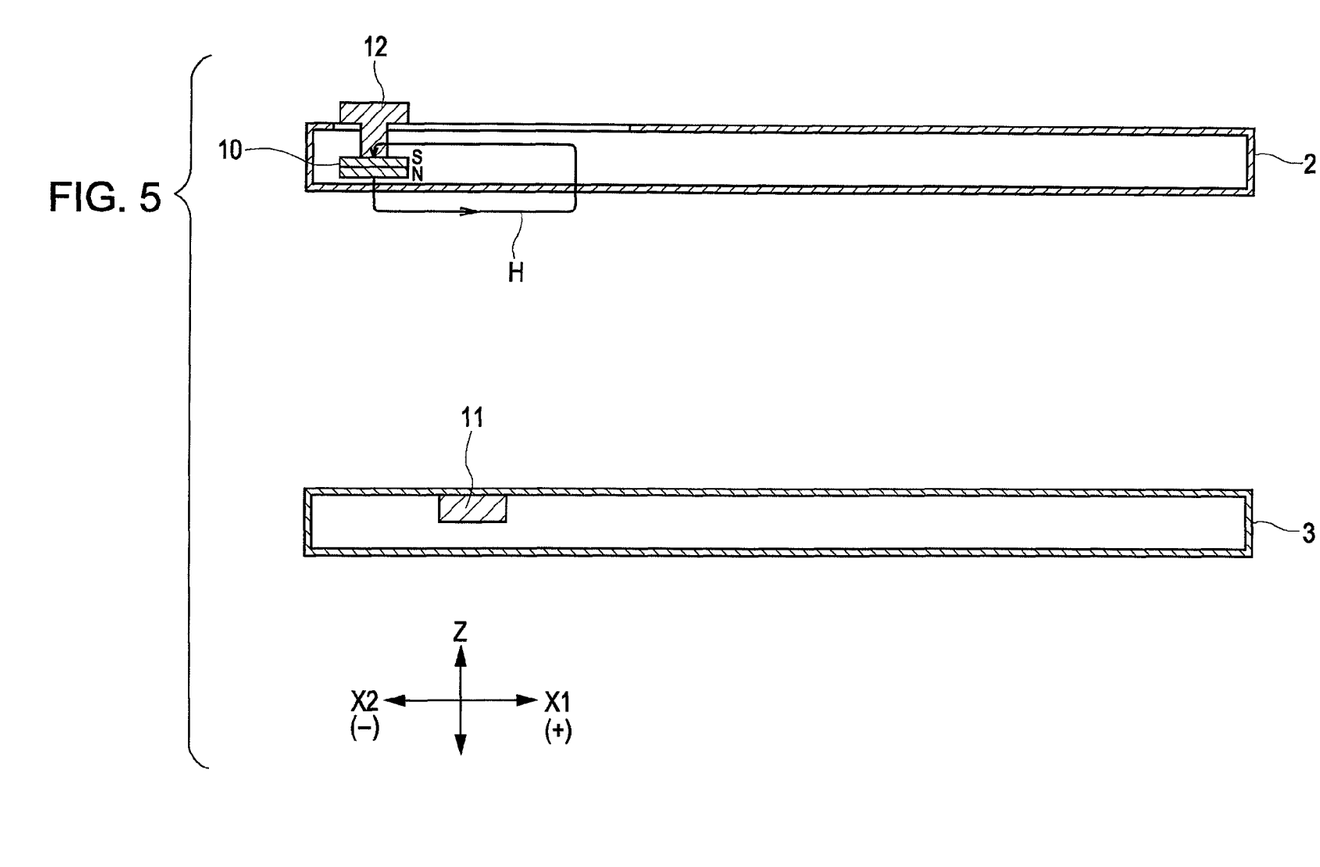
FIG. 5 is a partial cross-sectional view showing a state where the notebook personal computer is opened from the state shown in FIG. 3.
Figure 6:
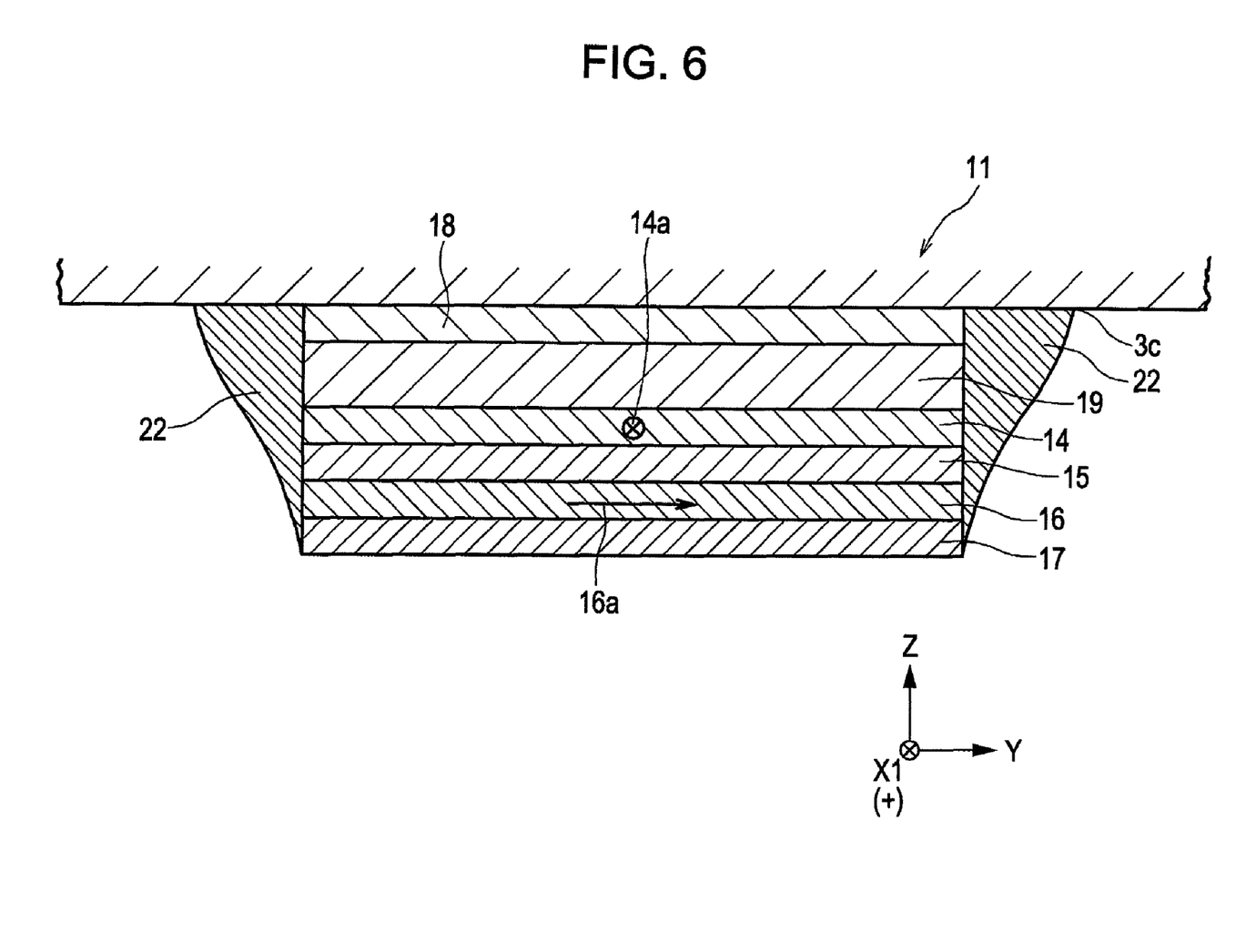
FIG. 6 is a partial cross-sectional view taken in the thickness direction of a magnetoresistance effect element (GMR element) according to an embodiment of the present invention.
Figure 7:
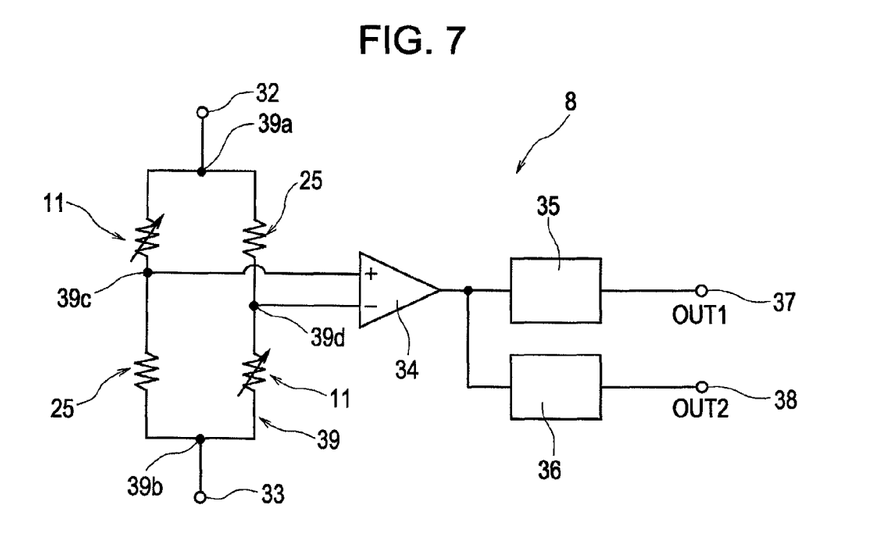
FIG. 7 is a schematic circuit diagram of a sensor unit according to this embodiment.
Figure 8:
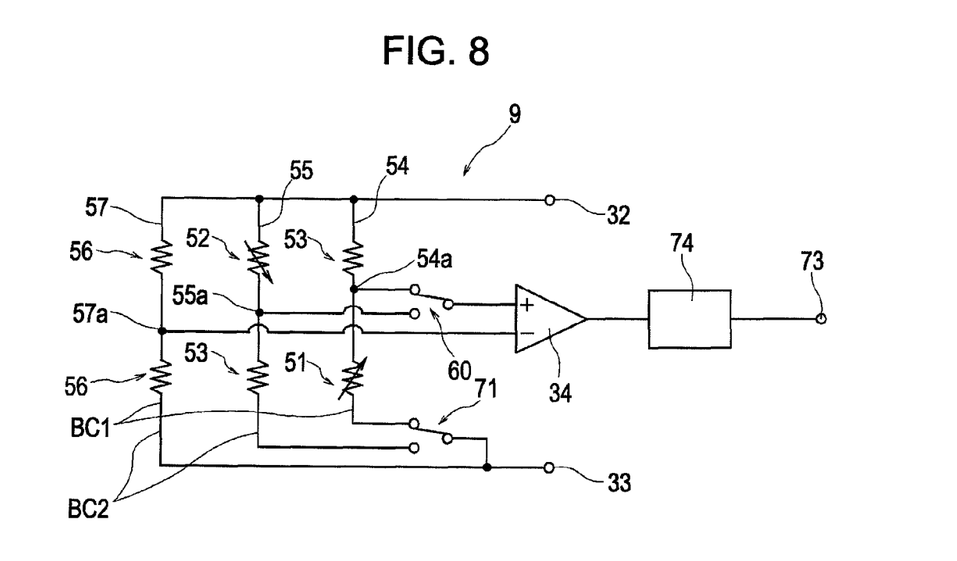
FIG. 8 is a schematic circuit diagram of a sensor unit according to an embodiment different from that shown in FIG. 7.
Figure 9:
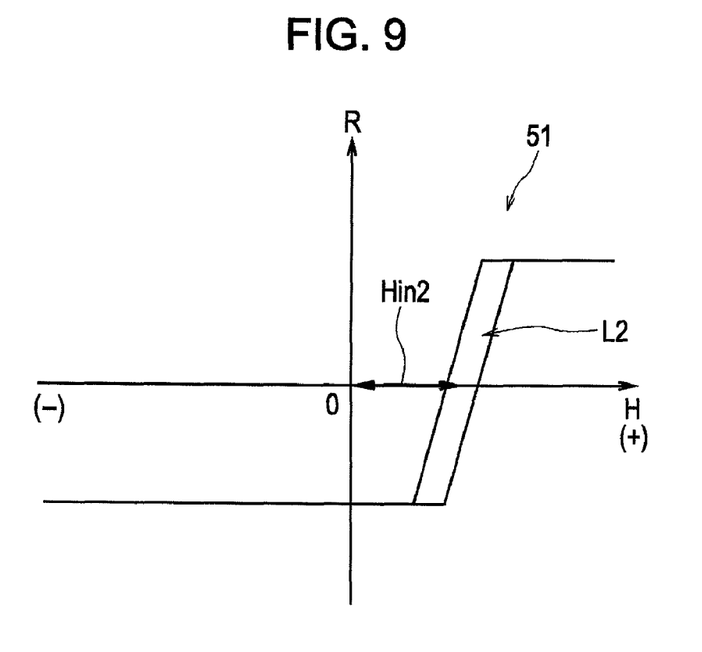
FIG. 9 is an R-H curve diagram of a second magnetoresistance effect element (GMR element) used in the circuit shown in FIG. 8.
Figure 10:
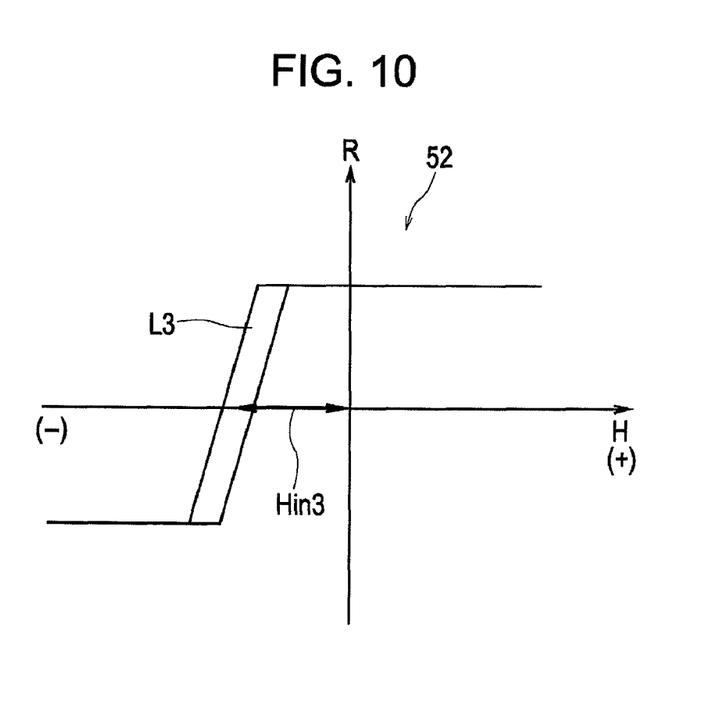
FIG. 10 is an R-H curve diagram of a third magnetoresistance effect element (GMR element) used in the circuit shown in FIG. 8.

FIG. 1 is a perspective view of a notebook personal computer shown in an opened state. FIG. 2 includes a perspective view of the notebook personal computer shown in a closed state and a front view of a monitor connected to the computer. FIG. 3 is a partial cross-sectional view taken in the height direction along line III-III in FIG. 2 as viewed from the direction of the arrows, and shows a first switch mode in the closed state of the notebook personal computer. FIG. 4 is a partial cross-sectional view corresponding to FIG. 3 and shows a second switch mode in the closed state of the notebook personal computer. FIG. 5 is a partial cross-sectional view showing a state where the notebook personal computer is opened from the state shown in FIG. 3. FIG. 6 is a partial cross-sectional view taken in the thickness direction of a magnetoresistance effect element (GMR element) according to an embodiment of the present invention. FIG. 7 is a schematic circuit diagram of a sensor unit according to this embodiment. FIG. 8 is a schematic circuit diagram of a sensor unit according to an embodiment different from that shown in FIG. 7. FIGS. 9 and 10 are R-H curve diagrams of magnetoresistance effect elements (GMR elements) used in the circuit shown in FIG. 8.

The X1-X2 direction in the drawings indicates a width direction, the Y direction indicates a depth direction, and the Z direction indicates a height direction. The three directions have a relationship such that each direction is orthogonal to the two remaining directions.

A notebook personal computer 1 according to this embodiment shown in FIGS. 1 and 2 includes a display housing (first body) 2 and a control housing (second body) 3. The display housing 2 and the control housing 3 are joined to each other in an openable/closable fashion.

When the notebook personal computer 1 is in an opened state as in FIG. 1, a display face (first face) 2a of the display housing 2 having a display screen 5, such as a liquid crystal display, and a control face 3a of the control housing 3 having a keyboard 6 and a touch pad 7 appear on the same side. Normally, in the state of FIG. 1, an operator performs a keyboard operation, touch-pad operation, mouse operation, etc, while looking at the display screen 5.

In the embodiment shown in FIG. 1, the display housing 2 contains a magnet 10 inside, and the control housing 3 contains a sensor unit 8 including a magnetoresistance effect element (GMR element) 11.

The notebook personal computer 1 in FIG. 2 is shown in a state where the display housing 2 and the control housing 3 are closed from the opened state in FIG. 1. As shown in FIG. 2, a cover face 2b on the opposite side of the display face 2a of the display housing 2 serves as a top surface most visible to an operator when the notebook personal computer 1 is closed. Normally, the cover face 2b has a logo of, for example, the manufacturer of the notebook personal computer 1.

An operating member 12 that supports the magnet 10 contained in the display housing 2 is exposed on the cover face 2b. A part of the operating member 12 protrudes from the cover face 2b, and this protruding part has the shape of a knob manipulable by an operator.

The cover face 2b has a moving path 2c for the operating member 12 such that the moving path 2c extends linearly in the X1-X2 direction. The operating member 12 is slidable in a reciprocating manner in the X1-X2 direction.

In the closed state shown in FIGS. 3 and 4, the magnet 10 coupled to the operating member 12 is magnetized such that the upper surface of the magnet 10 as viewed in the height direction (Z direction) is magnetized to have the S-pole whereas the lower surface is magnetized to have the N-pole.

Referring to FIGS. 2 and 3, the moving path 2c has a length T1 in the X1-X2 direction. When the control housing 3 and the display housing 2 are in the closed state as in FIGS. 2 to 4, the magnetoresistance effect element 11 contained in the control housing 3 faces the moving path 2c in the height direction (Z direction), and moreover, the center of the magnetoresistance effect element 11 in the X1-X2 direction is aligned with the center of the moving path 2c having the length T1. In the case where there are two magnetoresistance effect elements 11 prepared as shown in the circuit diagram in FIG. 7, the magnetoresistance effect elements 11 are, for example, arranged with a predetermined distance therebetween in the Y direction.

Referring to FIG. 3, by slidably shifting the operating member 12, the magnet 10 can be switched alternately between a state where the magnet 10 is positioned on the left side (i.e. on the X2 side or the front side) of the magnetoresistance effect element 11 and a state where the magnet 10 is positioned on the right side (i.e. on the X1 side or the rear side) of the magnetoresistance effect element 11.

In this embodiment, the X1 direction and the X2 direction will be defined as a positive (+) direction and a negative (−) direction, respectively. It should be noted however that which of the directions are to be defined as the positive (+) and negative (−) directions can be determined arbitrarily.

When the operating member 12 is slidably shifted leftward so that the magnet 10 is positioned on the left side (X2 side) of the magnetoresistance effect element 11 as shown in FIG. 3, an external magnetic field H generated by the magnet 10, which is supported by the operating member 12, enters the magnetoresistance effect element 11 in the control housing 3 as a horizontal magnetic field acting in the positive (+) direction.

On the other hand, when the operating member 12 is slidably shifted rightward so that the magnet 10 is positioned on the right side (X1 side) of the magnetoresistance effect element 11 as shown in FIG. 4, the external magnetic field H generated by the magnet 10 enters the magnetoresistance effect element 11 in the control housing 3 as a horizontal magnetic field acting in the negative (−) direction.

Accordingly, in this embodiment, the reciprocation of the operating member 12 between the X1 and X2 directions allows an external magnetic field H in the positive (+) direction and an external magnetic field H in the negative (−) direction to enter the magnetoresistance effect element 11 from the magnet 10 (alternately) at different timings.

Referring to FIG. 6, the magnetoresistance effect element 11 has a multilayer structure including, for example, a seed layer 18 composed of NiFeCr, etc., an antiferromagnetic layer 19 composed of IrMn, PtMn, etc., a fixed magnetic layer 14 composed of a ferromagnetic material such as NiFe, CoFe, etc., a nonmagnetic intermediate layer 15 composed of Cu, etc., a free magnetic layer 16 composed of a ferromagnetic material such as NiFe, CoFe, etc., and a protection layer 17 composed of Ta, etc. in that order from a formation surface 3c.

As shown in FIG. 6, the magnetoresistance effect element 11 is also provided with hard bias layers 22 and 22 disposed on opposite sides of the multilayered body (in the Y direction) and extending from the seed layer 18 to the protection layer 17.

Since the antiferromagnetic layer 19 and the fixed magnetic layer 14 are disposed in contact with each other in the magnetoresistance effect element 11, implementation of an annealing treatment under applied magnetic field can allow an exchange coupling magnetic field (Hex) to be generated in the interface between the antiferromagnetic layer 19 and the fixed magnetic layer 14, whereby a magnetization direction 14a of the fixed magnetic layer 14 can be fixed to one direction. In FIG. 6, the magnetization direction 14a is fixed to the X1 direction. The term "PIN direction" in FIGS. 3 and 4 corresponds to the magnetization direction 14a.

On the other hand, the free magnetic layer 16 is affected by a bias magnetic field from the hard bias layers 22 disposed on opposite sides of the free magnetic layer 16 in the Y direction and is thus magnetized in a magnetization direction 16a corresponding to the Y direction which is orthogonal to the magnetization direction 14a of the fixed magnetic layer 14. Unlike the fixed magnetic layer 14, the free magnetic layer 16 is not magnetically fixed, and the magnetization direction thereof is variable depending on the external magnetic field.

The magnetoresistance effect element 11 is a giant magnetoresistance (GMR) element that utilizes a giant magnetoresistive effect. In the GMR element, the electric resistance is changeable depending on the magnetic relationship between the free magnetic layer 16 and the fixed magnetic layer 14. The electric resistance decreases to the minimum level when the magnetization direction 16a of the free magnetic layer 16 and the magnetization direction 14a of the fixed magnetic layer 14 are parallel to each other, whereas the electric resistance increases to the maximum level when the magnetization direction 16a of the free magnetic layer 16 and the magnetization direction 14a of the fixed magnetic layer 14 are anti-parallel to each other.

Referring to FIGS. 3 and 4, the external magnetic field H acting on the magnetoresistance effect element 11 from the magnet 10 enters the magnetoresistance effect element 11 in a planar direction parallel to a multilayer interface (X-Y plane) in the multilayer structure of the magnetoresistance effect element 11.

The magnetization direction 16a of the free magnetic layer 16 in the above-described magnetoresistance effect element 11 varies in response to a change in the direction of a horizontal magnetic field, which corresponds to an external magnetic field H in the planar direction parallel to the multilayer interface. This variation of the magnetization direction 16a results in a change in the relationship between the magnetization direction 16a of the free magnetic layer 16 and the magnetization direction 14a of the fixed magnetic layer 14, thus causing the electric resistance to change. Accordingly, it is necessary to design the arrangement of the magnetoresistance effect element 11 and the magnet 10 in a manner such that a horizontal magnetic field can be applied to the magnetoresistance effect element 11.

Referring to FIG. 3, when an external magnetic field H in the positive (+) direction is applied to the magnetoresistance effect element 11 in the X1 direction, the magnetization direction 16a of the free magnetic layer 16 changes to the X1 direction. In this case, the magnetization direction 14a of the fixed magnetic layer 14 and the magnetization direction 16a of the free magnetic layer 16 become parallel to each other, whereby the electric resistance decreases.

On the other hand, referring to FIG. 4, when an external magnetic field H in the negative (−) direction is applied to the magnetoresistance effect element 11 in the X2 direction, the magnetization direction 16a of the free magnetic layer 16 changes to the X2 direction. In this case, the magnetization direction 14a of the fixed magnetic layer 14 and the magnetization direction 16a of the free magnetic layer 16 become anti-parallel to each other, whereby the electric resistance increases.

Referring to FIG. 7, the sensor unit 8 in this embodiment includes an integrated circuit that is connected to the magnetoresistance effect element 11 and that outputs a magnetic-field detection signal on the basis of a change in the electric resistance of the magnetoresistance effect element 11.

As shown in FIG. 7, there are actually two magnetoresistance effect elements 11 provided. Each of these magnetoresistance effect elements 11 is series-connected to a fixed resistor element 25. These four elements constitute a bridge circuit 39. As shown in FIG. 7, the two series circuits are parallel-connected by means of two connector portions 39a and 39b. One of the connector portions 39a has an input terminal 32 connected thereto, while the other connector portion 39b has a ground terminal 33 connected thereto. Moreover, the bridge circuit 39 has two output portions 39c and 39d that are connected to a differential amplifier 34. The differential amplifier 34 is connected to first and second comparators 35 and 36. The two comparators 35 and 36 are respectively connected to a first output terminal 37 and a second output terminal 38. Although there are actually two magnetoresistance effect elements 11 provided, the description hereinafter may sometimes refer to the two magnetoresistance effect elements 11 as a "magnetoresistance effect element 11" for the sake of convenience.

The first comparator 35 has a first threshold level (voltage value) LV1 set therein. When receiving a voltage value higher than this first threshold level LV1, the first comparator 35 is configured to generate an ON signal (magnetic-field detection signal).

On the other hand, the second comparator 36 has a second threshold level (voltage value) LV2 set therein. When receiving a voltage value lower than this second threshold level LV2, the second comparator 36 is configured to generate an ON signal.

When the magnet 10 is positioned to the left of the magnetoresistance effect element 11 such that an external magnetic field H in the positive (+) direction enters the magnetoresistance effect element 11 from the magnet 10 as shown in FIG. 3, the first comparator 35 receives a voltage value higher than the first threshold level (voltage value) LV1. In this case, an ON signal is output from the first output terminal 37 while an OFF signal is output from the second output terminal 38. Consequently, the first comparator 35 is capable of detecting an external magnetic field H in the positive (+) direction and can output a positive (+) magnetic-field detection signal (ON signal) via the first output terminal 37.

On the other hand, when the magnet 10 is positioned to the right of the magnetoresistance effect element 11 such that an external magnetic field H in the negative (−) direction enters the magnetoresistance effect element 11 from the magnet 10 as shown in FIG. 4, the second comparator 36 receives a voltage value lower than the second threshold level (voltage value) LV2. In this case, an ON signal is output from the second output terminal 38 while an OFF signal is output from the first output terminal 37. Consequently, the second comparator 36 is capable of detecting an external magnetic field H in the negative (−) direction and can output a negative (−) magnetic-field detection signal (ON signal) via the second output terminal 38.

A processing circuit in the notebook personal computer 1 can activate different modes between a condition in which an ON signal is output from the first output terminal 37 while an OFF signal is output from the second output terminal 38 and a condition in which an ON signal is output from the second output terminal 38 while an OFF signal is output from the first output terminal 37.

For example, when an ON signal is output from the first output terminal 37 and an OFF signal from the second output terminal 38, the notebook personal computer 1 is set to a non-sleep mode so that the display screen 5 can be kept turned on in the same manner as when the notebook personal computer 1 is under the normal operation mode. In contrast, when an ON signal is output from the second output terminal 38 and an OFF signal from the first output terminal 37, the notebook personal computer 1 is set to a sleep mode so that the display screen 5 can be set to an OFF mode.

Accordingly, the notebook personal computer 1 is switchable between a sleep mode and a non-sleep mode depending on whether the operating member 12 is slidably shifted leftward as in FIG. 3 or rightward as in FIG. 4.

For example, in the case where the notebook personal computer 1 is in a sleep mode while the display housing 2 and the control housing 3 are in a closed state as in FIG. 2, the present embodiment eliminates the need for opening the display housing 2 and the control housing 3 and then performing a predetermined operation to release the sleep mode. In this embodiment, the sleep mode can be released to turn on the display screen 5 by simply sliding the operating member 12 shown in FIG. 2 towards the X2 side while the housings 2 and 3 are still kept in the closed state. Therefore, when a separate large-sized monitor 30 is connected to the notebook personal computer 1, even while the display housing 2 and the control housing 3 are kept in the closed state as shown in FIG. 2, the same content as that displayed on the display screen 5 of the notebook personal computer 1 can be displayed on a screen 30a of the monitor 30 by simply sliding the operating member 12 towards the X2 side.

Furthermore, in this embodiment, the sensor unit 8 contained in the control housing 3 and the magnet 10 contained in the display housing 2 can also be used for the detection of opening and closing of the display housing 2 and the control housing 3.

Specifically, referring to FIGS. 3 and 4, in the state where the control housing 3 and the display housing 2 are closed, an ON signal is output from either the first output terminal 37 or the second output terminal 38 shown in FIG. 7. In this case, the processing circuit of the notebook personal computer 1 determines that the control housing 3 and the display housing 2 are in a closed state.

On the other hand, when the control housing 3 and the display housing 2 are opened as shown in FIG. 5, the external magnetic field H entering the magnetoresistance effect element 11 from the magnet 10 gradually decreases in magnetic intensity and eventually becomes ineffective. In this case, OFF signals are output from both the first output terminal 37 and the second output terminal 38, and the processing circuit of the notebook personal computer 1 thus determines that the control housing 3 and the display housing 2 are in an opened state.

Although the sensor unit 8 shown in FIG. 7 is equipped with only a single kind of magnetoresistance effect elements 11, an alternative sensor unit 9 shown in FIG. 8, for example, may be equipped with two kinds of magnetoresistance effect elements 51 and 52. The magnetoresistance effect elements 51 and 52 have the same multilayer structure as the magnetoresistance effect element 11 shown in FIG. 6. However, these magnetoresistance effect elements 51 and 52 are not provided with the hard bias layers 22.

The magnetoresistance effect elements 51 and 52 have R-H curves shown in FIGS. 9 and 10, respectively. FIG. 9 illustrates an R-H curve of the second magnetoresistance effect element 51. As shown in FIG. 9, the R-H curve is in the form of a loop, and moreover, a loop section L2 is biased towards the external magnetic field in the positive (+) direction.

An interlayer coupling magnetic field Hin (which will be referred to as a "second interlayer coupling magnetic field Hin2" hereinafter) is determined on the basis of the magnetic intensity between the midpoint of the loop section L2 and a point at which the external magnetic field reaches the zero line.

On the other hand, FIG. 10 illustrates an R-H curve of the third magnetoresistance effect element 52. As shown in FIG. 10, the R-H curve is in the form of a loop, and moreover, a loop section L3 is biased towards the external magnetic field in the negative (−) direction.

An interlayer coupling magnetic field Hin (which will be referred to as a "third interlayer coupling magnetic field Hin3" hereinafter) is determined on the basis of the magnetic intensity between the midpoint of the loop section L3 and the point at which the external magnetic field reaches the zero line.

The interlayer coupling magnetic field Hin2, Hin3 is a coupling magnetic field applied between the fixed magnetic layer 14 and the free magnetic layer 16. For example, the interlayer coupling magnetic fields Hin2 and Hin3 can each be shifted towards the positive (+) magnetic-field side or the negative (−) magnetic-field side by appropriately adjusting the thickness of the nonmagnetic intermediate layer 15 or by adjusting the gas flow (gas pressure) or the voltage value when a plasma treatment (PT) is performed on the surface of the nonmagnetic intermediate layer 15.

Referring to FIG. 8, the second magnetoresistance effect element 51 and the third magnetoresistance effect element 52 are series-connected to corresponding fixed resistor elements 53 so as to constitute a first series circuit 54 and a second series circuit 55, respectively. Furthermore, a third series circuit 57 including two series-connected fixed resistor elements 56 is also provided.

The first series circuit 54 and the third series circuit 57 are parallel-connected to each other so as to constitute a first bridge circuit BC1, and moreover, the second series circuit 55 and the third series circuit 57 are parallel-connected to each other so as to constitute a second bridge circuit BC2.

The midpoint potential of the third series circuit 57 having the series-connected fixed resistor elements 56 is shared as a reference potential by the first bridge circuit BC1 and the second bridge circuit BC2. Furthermore, a first switch circuit 60 is provided for alternately switching between two connection states, namely, a connection state between a first output portion 54*a* of the first series circuit 54 included in the first bridge circuit BC1 and the differential amplifier 34 and a connection state between a second output portion 55*a* of the second series circuit 55 included in the second bridge circuit BC2 and the differential amplifier 34. The differential amplifier 34 is connected to an output terminal 73 via a comparator 74.

As mentioned above, the third series circuit 57 serves as a common circuit shared by the first bridge circuit BC1 and the second bridge circuit BC2 in FIG. 8. Consequently, the sensor unit 9 can have a circuit configuration in which a third output portion 57*a* of the third series circuit 57 is directly connected to a single differential amplifier 34 and in which the first switch circuit 60 is configured to switch between the connection states, i.e. the connection state between the first output portion 54*a* of the first series circuit 54 and the differential amplifier 34 and the connection state between the second output portion 55*a* of the second series circuit 55 and the differential amplifier 34. With only a single differential amplifier 34 provided in this circuit configuration, two detection modes can be alternately obtained, which are a positive (+) direction external-magnetic-field detection mode in which the first bridge circuit BC1 and the differential amplifier 34 are connected and a negative (−) direction external-magnetic-field detection mode in which the second bridge circuit BC2 and the differential amplifier 34 are connected. Accordingly, with a simple circuit configuration, a differential potential can be properly obtained at the differential amplifier 34 from both the first bridge circuit BC1 and the second bridge circuit BC2.

In the first bridge circuit BC1, the resistance of the second magnetoresistance effect element 51 changes with respect to an external magnetic field H in the positive (+) direction. Therefore, when the operating member 12 is slidably shifted leftward as in FIG. 3, the electric resistance value of the second magnetoresistance effect element 51 changes, whereby an external magnetic field H in the positive (+) direction becomes detectable. On the other hand, in the second bridge circuit BC2, the resistance of the third magnetoresistance effect element 52 changes with respect to an external magnetic field H in the negative (−) direction. Therefore, when the operating member 12 is slidably shifted rightward as in FIG. 4, the electric resistance value of the third magnetoresistance effect element 52 changes, whereby an external magnetic field H in the negative (−) direction becomes detectable.

When an ON signal (magnetic-field detection signal) is obtained from the single output terminal 73 shown in FIG. 8 detects the switching of the first switch circuit 60 and determines whether the ON signal is obtained under the positive (+) magnetic-field detection mode or under the negative (−) magnetic-field detection mode. Based on this determination, the sensor unit 9 can determine whether the operating member 12 is positioned to the left of the magnetoresistance effect elements as in FIG. 3 or to the right of the magnetoresistance effect elements as in FIG. 4. Consequently, the sensor unit 9 in FIG. 8 can similarly allow for switching between different modes, namely, a sleep mode and a non-sleep mode, on the basis of a magnetic-field detection signal that is obtainable in the sensor unit 9 by simply sliding the operating member 12 in a state where the control housing 3 and the display housing 2 are closed as in FIG. 2.

In the embodiment shown in FIG. 8, a second switch circuit 71 is provided for switching between two connection states, namely, a connection state between the ground terminal 33 and the first series circuit 54 and a connection state between the ground terminal 33 and the second series circuit 55.

When the first bridge circuit BC1 and the differential amplifier 34 are connected to each other through the first switch circuit 60, the second switch circuit 71 connects the first series circuit 54 and the ground terminal 33. On the other hand, when the second bridge circuit BC2 and the differential amplifier 34 are connected to each other through the first switch circuit 60, the second switch circuit 71 connects the second series circuit 55 and the ground terminal 33. Accordingly, when the first bridge circuit BC1 and the differential amplifier 34 are in a connected state, the electric current does not flow to the second series circuit 55, whereas when the second bridge circuit BC2 and the differential amplifier 34 are in a connected state, the electric current does not flow to the first series circuit 54. This reduces current consumption as well as improving the detection sensitivity.

In the above embodiments, the operating member 12 is supported in a linearly slidable fashion, and is capable of creating two states, namely, a state in which the operating member 12 positions the magnet 10 to the left of the magnetoresistance effect element 11 as in FIG. 3 so as to allow an external magnetic field H to enter the magnetoresistance effect element 11 in the positive (+) direction from the magnet 10 and a state in which the operating member 12 positions the magnet 10 to the right of the magnetoresistance effect element 11 as in FIG. 4 so as to allow an external magnetic field H to enter the magnetoresistance effect element 11 in the negative (−) direction from the magnet 10.

Figure 11:
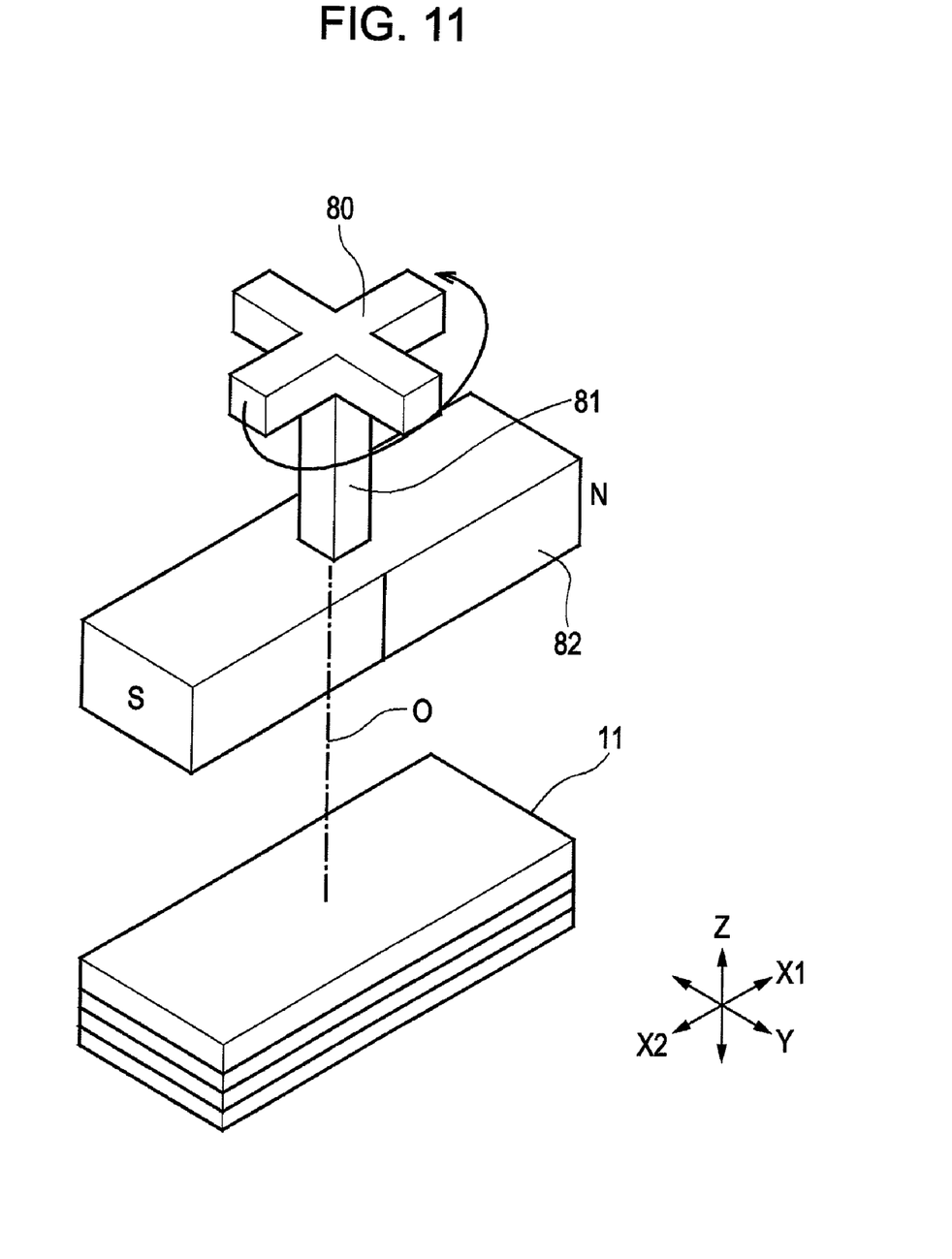
FIG. 11 is a perspective view showing a magnetic detection device according to another embodiment.

In another embodiment shown in FIG. 11, an operating member 80 is supported in a rotatable fashion about a shaft 81 serving as a rotation axis. FIG. 11 is a perspective view showing the operating member 80, a magnet 82, and the magnetoresistance effect element 11 when the control housing 3 and the display housing 2 of the notebook personal computer 1 are closed as in FIG. 12.

The magnetoresistance effect element 11 shown in FIG. 11 has the same multilayer structure as that shown in FIG. 6, and the circuit configuration of the sensor unit 8 is also the same as that shown in FIG. 7.

Figure 12:
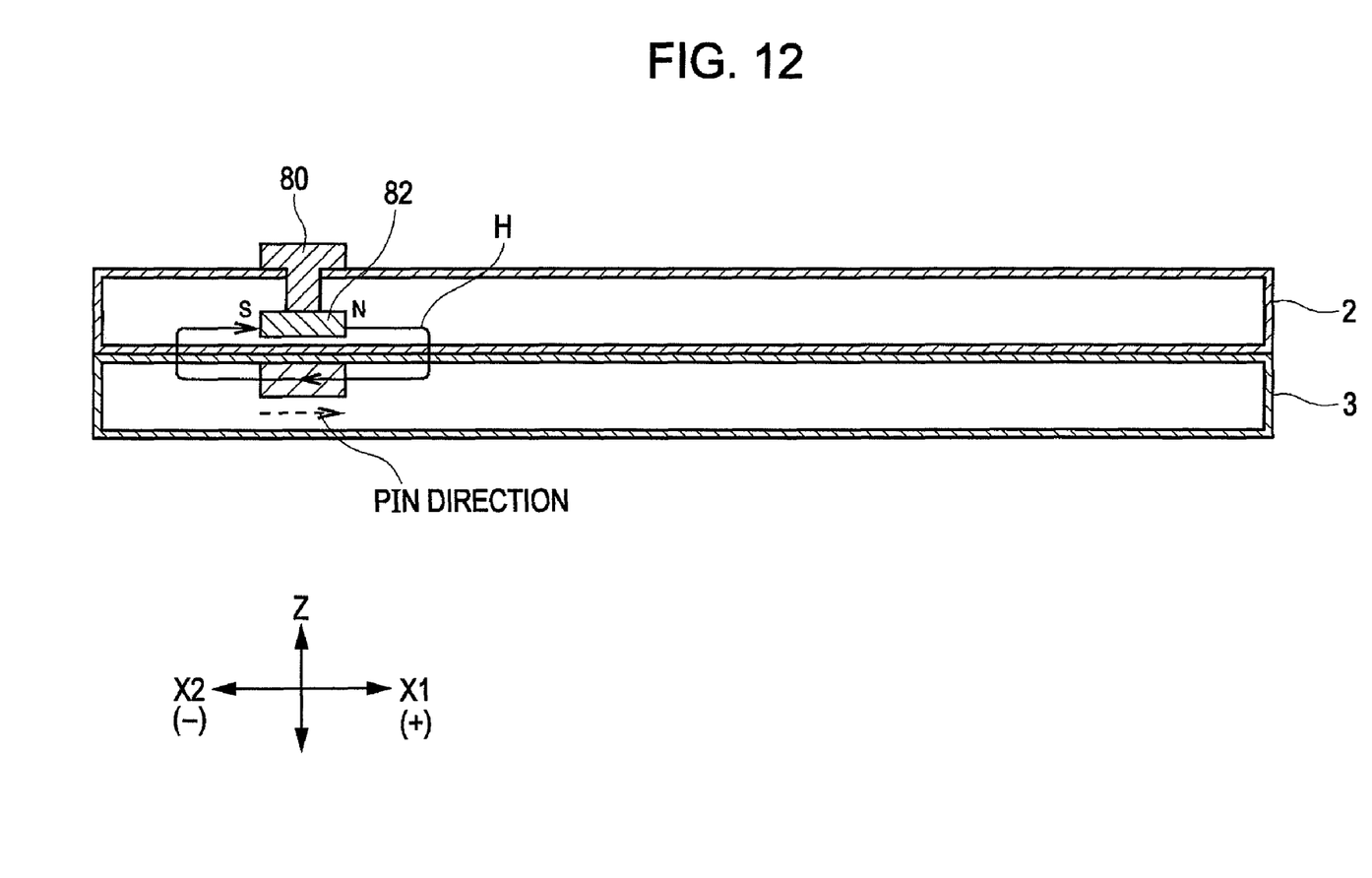
FIG. 12 is a partial cross-sectional view showing a closed state of a notebook personal computer containing the magnetic detection device in FIG. 11.

When the control housing 3 and the display housing 2 are closed as in FIG. 12, the magnet 82 and the magnetoresistance effect element 11 face each other in the height direction (Z direction) as shown in FIG. 11, and moreover, the center of the X-Y plane (multilayer interface) of the magnetoresistance effect element 11 and the center of the X-Y plane of the magnet 82 are aligned with each other on an axis O of the shaft 81.

One of the side surfaces of the magnet 82 extending orthogonally to the upper and lower surfaces of the magnet 82 is magnetized to have the N-pole, whereas the other side surface opposite to the aforementioned side surface is magnetized to have the S-pole.

Figure 13:
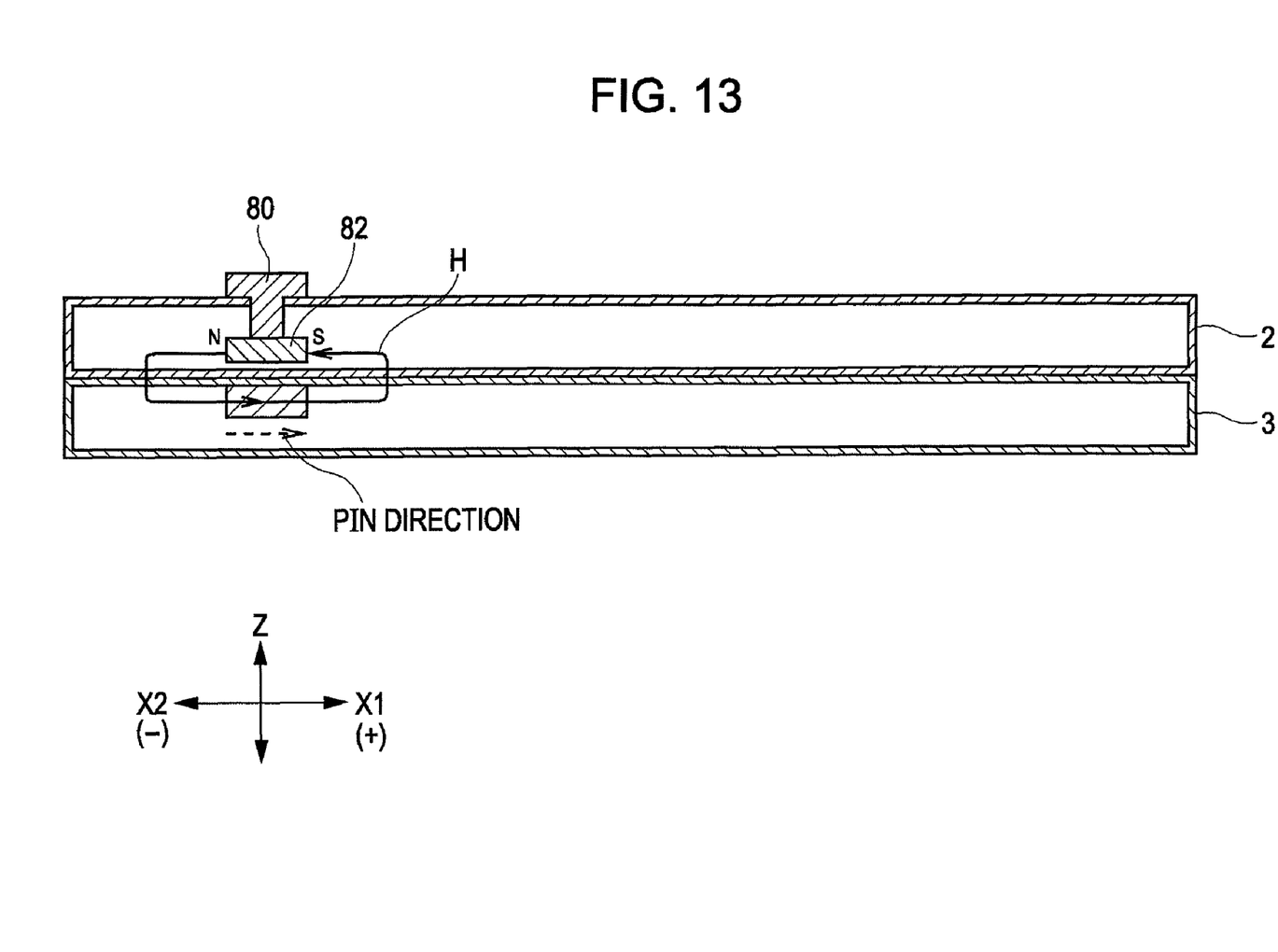
FIG. 13 is a partial cross-sectional view showing a state where a magnet is rotated from the state shown in FIG. 12.

Referring to FIGS. 12 and 13, an external magnetic field H enters the magnetoresistance effect element 11 in a planar direction parallel to the multilayer interface (X-Y plane). In the state shown in FIG. 12, the N-pole of the magnet 82 is positioned on the right side and the S-pole is positioned on the left side. In this state, an external magnetic field H in the negative (−) direction enters the magnetoresistance effect element 11 in the planar direction parallel to the multilayer interface.

When the operating member 80 in FIG. 11 is rotated 180° as shown with an arrow in FIG. 11, the N-pole of the magnet 82 becomes shifted to the left side and the S-pole becomes shifted to the right side as shown in FIG. 13. This causes an external magnetic field H in the positive (+) direction to enter the magnetoresistance effect element 11 in the planar direction parallel to the multilayer interface.

The state shown in FIG. 12 is similar to that in FIG. 4 in that the magnetization direction 14a of the fixed magnetic layer 14 and the magnetization direction 16a of the free magnetic layer 16 are anti-parallel to each other. In this state, the resistance value of the magnetoresistance effect element 11 increases to the maximum level. On the other hand, the state shown in FIG. 13 is similar to that in FIG. 3 in that the magnetization direction 14a of the fixed magnetic layer 14 and the magnetization direction 16a of the free magnetic layer 16 are parallel to each other. In this state, the resistance value of the magnetoresistance effect element 11 decreases to the minimum level.

Based on a change in the electric resistance of the magnetoresistance effect element 11 described above, an ON signal (magnetic-field detection signal) output from either the first output terminal 37 or the second output terminal 38 can be obtained by the integrated circuit provided in the sensor unit 8 shown in FIG. 7. By detecting which one of the output terminals the ON signal is output from, the rotational condition of the operating member 80 can be determined. Based on the rotational condition, a switching operation between a sleep mode and a non-sleep mode can be implemented.

Accordingly, in the above embodiments, the magnet is supported in either a reciprocable or rotatable fashion with respect to the magnetoresistance effect element. The reciprocation or the rotation of the magnet allows an external magnetic field in the positive (+) direction and an external magnetic field in the negative (−) direction, which is opposite to the positive (+) direction, to enter the magnetoresistance effect element from the magnet at different timings in the planar direction parallel to the multilayer interface of the multilayered magnetoresistance effect element.

Concerning a magnetoresistance effect element that utilizes a magnetoresistive effect, the electric resistance thereof changes in response to a change in the direction of an external magnetic field applied in the planar direction parallel to the multilayer interface. This implies that when an external magnetic field in the positive (+) direction or an external magnetic field in the negative (−) direction enters the magnetoresistance effect element, the electric resistance of the magnetoresistance effect element changes. In particular, the resistance of the magnetoresistance effect element changes with excellent linearity in response to a change in the direction of an external magnetic field.

In response to the reciprocation or the rotation of the magnet described above, the integrated circuit provided in the magnetic detection device according to the above embodiments can output a positive (+) magnetic-field detection signal on the basis of a change in the electric resistance of the magnetoresistance effect element caused by an external magnetic field in the positive (+) direction, or can output a negative (−) magnetic-field detection signal on the basis of a change in the electric resistance of the magnetoresistance effect element caused by an external magnetic field in the negative (−) direction.

The magnetic detection device according to the above embodiments can thus achieve a noncontact feature as well as a dipole detection feature with a simple configuration. In addition, the magnetic detection device can be reduced in size since it only requires a space in which the magnet can be reciprocated or rotated for allowing an external magnetic field in the positive (+) or negative (−) direction to be applied to the magnetoresistance effect element.

In the case where the magnet is given the rotatable feature, the magnet may alternatively be configured to be, for example, rotatable around the magnetoresistance effect element. However, the configuration with the magnet 82 rotatable about its own central axis as shown in FIG. 11 is more preferable as it can contribute to further reduction in the size of the magnetic detection device.

With the magnetic detection device according to the above embodiments incorporated in the notebook personal computer 1 shown in FIG. 1, the notebook personal computer 1 can be switched between two different modes, i.e. a sleep mode and a non-sleep mode, by simply sliding or rotating the operating member 12 or 80.

Furthermore, in the above embodiments, the notebook personal computer 1 can be readily switched to a predetermined mode when the control housing 3 and the display housing 2 are in a closed state as in FIG. 2 by simply operating the operating member 12 or 80.

Furthermore, in the above embodiments, the magnetic detection device can also be used for the detection of opening and closing of the display housing 2 and the control housing 3. Thus, a single magnetic detection device can be used both for the switching operation between predetermined modes by means of the operating member 12 or 80 and for the opening/closing detection. This favorably reduces the space occupied by the magnetic detection device within the notebook personal computer 1.

Although the magnetoresistance effect element 11 shown in FIG. 6 is a GMR element that utilizes a giant magnetoresistive (GMR) effect, the GMR element may be replaced by a tunnel magnetoresistance (TMR) element that utilizes a tunnel magnetoresistive effect. In this case, the TMR element is formed by replacing the nonmagnetic conducting material used for forming the nonmagnetic intermediate layer 15 by an insulating material such as $Al_2O_3$ or $TiO_2$.

Although the magnet is configured to be reciprocated or rotated in the above embodiments, the magnetoresistance effect element may alternatively be configured to be reciprocated or rotated or both the magnet and the magnetoresistance effect element may alternatively be supported in a reciprocable or rotatable fashion.

Although the magnet 10 is reciprocable in a linear manner in FIGS. 3 and 4, the magnet 10 does not necessarily need to be shifted in such a linear manner. As long as the external magnetic fields H in the positive (+) and negative (−) directions can be set to enter the magnetoresistance effect element 11 at different timings, the magnet 10 may be made reciprocable in any desired manner. However, it is more preferable that the magnet 10 be made shiftable in a linear manner since the external magnetic fields H in the positive (+) and negative (−) directions can be set to enter the magnetoresistance effect element 11 at different timings with a simple configuration.

In the above embodiments, the two modes that can be switched by sliding or rotating the operating member 12 or 80 in the notebook personal computer 1 are a sleep mode and a non-sleep mode (display-screen ON mode). However, the switchable modes may be arbitrarily determined.

For example, in place of the notebook personal computer 1, the magnetic detection device according to the above embodiments can be applied to a folding portable phone or to a game apparatus. In the case of a portable phone, the magnetic detection device according to the above embodiments can be used for switching between two modes such as a music playback mode and a sleep mode.

The above embodiments are directed to an electronic apparatus having a first component and a second component that are joined to each other in an openable/closable fashion. Alternatively, the magnetic detection device according to the above embodiments can be used in an electronic apparatus of a non-openable/closable type.

Furthermore, when the magnet 82 is configured to be rotatable as shown in FIG. 11, for example, an external magnetic field H can be applied to the magnetoresistance effect element 11 from a 360° range. Since the resistance of the magnetoresistance effect element 11 changes with excellent linearity in response to a change in the direction of an external magnetic field as mentioned above, the magnetic detection device can be applied to, for example, a rotating volume knob by utilizing such characteristics.

What is claimed is:

1. A magnetic detection device comprising:
   a magnetoresistance effect element having a multilayer structure and utilizing a magnetoresistive effect in which an electric resistance of the magnetoresistance effect element changes with respect to an external magnetic field;
   an integrated circuit connected to the magnetoresistance effect element and outputting a magnetic-field detection signal on the basis of a change in the electric resistance; and
   a magnet for generating the external magnetic field,
   wherein the magnetoresistance effect element and the magnet are disposed facing each other with a certain distance therebetween, and wherein at least one of the magnetoresistance effect element and the magnet is supported in a reciprocable fashion towards a front side or rear side of the other one of the magnetoresistance effect element and the magnet or in a rotatable fashion with respect to said other one so as to allow an external magnetic field in a positive direction and an external magnetic field in a negative direction opposite to the positive direction to enter the magnetoresistance effect element from the magnet at different timings in a planar direction parallel to a multilayer interface of the multilayer structure, and
   wherein, in response to reciprocation or rotation of said at least one of the magnetoresistance effect element and the magnet, the integrated circuit outputs a positive-magnetic-field detection signal on the basis of a change in the electric resistance of the magnetoresistance effect element caused by the external magnetic field in the positive direction, and outputs a negative-magnetic-field detection signal on the basis of a change in the electric resistance of the magnetoresistance effect element caused by the external magnetic field in the negative direction.

2. The magnetic detection device according to claim 1, wherein a center of the magnetoresistance effect element and a center of the magnet are positioned on a same central axis, and wherein said at least one of the magnetoresistance effect element and the magnet is supported rotatably about the central axis serving as a rotation axis.

3. An electronic apparatus comprising:

the magnetic detection device according to claim 1; and a reciprocatingly manipulable or rotationally manipulable operating member on a surface of the electronic apparatus, wherein the operating member supports the magnetoresistance effect element or the magnet, and wherein the electronic apparatus is switchable between predetermined modes on the basis of the positive-magnetic-field detection signal and the negative-magnetic-field detection signal output at the integrated circuit when the operating member is operated.

4. The electronic apparatus according to claim 3, further comprising a first component and a second component that are supported in an openable and closable fashion, wherein the operating member is provided on a surface of one of the first component and the second component when the first component and the second component are closed.

5. The electronic apparatus according to claim 4, wherein the magnetoresistance effect element and the integrated circuit are contained in one of the first component and the second component, and the magnet is contained in the other one of the first component and the second component, and wherein opening and closing of the first component and the second component are detectable on the basis of a change in the electric resistance of the magnetoresistance effect element occurring in response to a change in magnetic intensity of the external magnetic field from the magnet, the change in magnetic intensity being caused by the opening and closing of the first component and the second component.

\* \* \* \* \*